US011656848B2

(12) United States Patent
Bal et al.

(10) Patent No.: US 11,656,848 B2
(45) Date of Patent: May 23, 2023

(54) HIGH THROUGHPUT PARALLEL ARCHITECTURE FOR RECURSIVE SINUSOID SYNTHESIZER

(71) Applicant: STMicroelectronics International N.V., Geneva (CH)

(72) Inventors: Ankur Bal, Greater Noida (IN); Rupesh Singh, Ghaziabad (IN)

(73) Assignee: STMicroelectronics International N.V., Geneva (CH)

(*) Notice: Subject to any disclaimer, the term of this patent is extended or adjusted under 35 U.S.C. 154(b) by 277 days.

(21) Appl. No.: 16/988,912

(22) Filed: Aug. 10, 2020

(65) Prior Publication Data

US 2021/0081174 A1 Mar. 18, 2021

Related U.S. Application Data

(60) Provisional application No. 62/902,006, filed on Sep. 18, 2019.

(51) Int. Cl.
| | | |
|---|---|---|
| *G06F 7/48* | (2006.01) | |
| *G06F 7/548* | (2006.01) | |
| *H03K 3/037* | (2006.01) | |
| *G06F 7/544* | (2006.01) | |
| *H03K 5/01* | (2006.01) | |
| *H03K 5/00* | (2006.01) | |

(52) U.S. Cl.
CPC ............ *G06F 7/548* (2013.01); *G06F 7/5443* (2013.01); *H03K 3/037* (2013.01); *H03K 5/01* (2013.01); *H03K 2005/00078* (2013.01)

(58) Field of Classification Search
CPC ....... G06F 7/548; G06F 7/5443; H03K 3/037; H03K 5/01; H03K 2005/00078; H03B 28/00
USPC ........................................................ 708/190
See application file for complete search history.

(56) References Cited

U.S. PATENT DOCUMENTS

| | | | | |
|---|---|---|---|---|
| 4,285,044 A | * | 8/1981 | Thomas ................. | G06F 1/022 327/107 |
| 4,577,287 A | * | 3/1986 | Chrin ..................... | G06F 1/022 708/276 |
| 4,888,719 A | * | 12/1989 | Yassa ..................... | G06F 7/548 708/276 |
| 5,892,407 A | | 4/1999 | Ishii | |
| 6,426,977 B1 | * | 7/2002 | Lee ......................... | H04K 1/00 375/259 |
| 6,867,625 B1 | * | 3/2005 | Stoyanov ............... | H03B 21/00 327/107 |
| 7,034,624 B1 | | 4/2006 | Gentile | |
| 7,123,666 B2 | | 10/2006 | Brown et al. | |
| 7,483,931 B2 | | 1/2009 | Shimotoyodome | |

(Continued)

*Primary Examiner* — Ryan Jager
(74) *Attorney, Agent, or Firm* — Crowe & Dunlevy

(57) ABSTRACT

A first multiplier multiplies a first input with a first coefficient and a first adder sums an output of the first multiplier and a second input to generate a first output. A second multiplier multiplies a third input with a second coefficient, a third multiplier multiplies a fourth input with a third coefficient, and a second adder sums outputs of the second and third multipliers to generate a second output. The second and third inputs are derived from the first output and the first and fourth inputs are derived from the second output. The first and second outputs generate digital values for first and second digital sinusoids, respectively.

28 Claims, 3 Drawing Sheets

(56) References Cited

U.S. PATENT DOCUMENTS

| | | | |
|---|---|---|---|
| 7,772,893 B2 | 8/2010 | Chen et al. | |
| 7,890,562 B2 | 2/2011 | Gross et al. | |
| 8,639,206 B1 * | 1/2014 | Ek | H03D 7/165 |
| | | | 455/114.1 |
| 8,655,934 B2 * | 2/2014 | Petrovic | H03B 21/025 |
| | | | 327/117 |
| 9,312,467 B2 | 4/2016 | Kim | |
| 9,772,972 B2 | 9/2017 | Pagnanelli | |
| 10,177,947 B2 | 1/2019 | Agee | |
| 11,422,773 B1 * | 8/2022 | Volpe | G06F 7/50 |
| 2005/0231871 A1 | 10/2005 | Karimi Ghartemani | |
| 2007/0071115 A1 * | 3/2007 | Suzuki | H04L 27/18 |
| | | | 375/E1.034 |
| 2010/0177903 A1 * | 7/2010 | Vinton | G10L 19/008 |
| | | | 381/20 |
| 2014/0043177 A1 * | 2/2014 | Pagnanelli | H03M 1/0836 |
| | | | 341/143 |
| 2015/0091745 A1 * | 4/2015 | Pagnanelli | H03M 3/468 |
| | | | 341/143 |
| 2016/0072520 A1 * | 3/2016 | Pagnanelli | H03M 3/358 |
| | | | 341/143 |

* cited by examiner

Recursive Digital Sinusoid Generator Network

HIGH THROUGHPUT PARALLEL ARCHITECTURE FOR RECURSIVE SINUSOID SYNTHESIZER

CROSS REFERENCE TO RELATED APPLICATIONS

This application claims priority from U.S. Provisional Application Patent No. 62/902,006 filed Sep. 18, 2019, the disclosure of which is incorporated by reference.

TECHNICAL FIELD

The present invention relates generally to the generation of a sinusoid signal and, more particularly, to a digital sinusoid generator.

BACKGROUND

It is known in the art that the Chebyshev method can be used as a recursive algorithm for sinusoid generation to find the nth multiple angle formula from the (n−1)th and (n−2)th entities. The formula is:

$$\sin(nx) = 2\cos x \sin((n-1)x) - \sin((n-2)x)$$

By replacing x with $\omega_0$, the above identity can be mathematically reduced to:

$$x_1(n) = x_1(n-1) + \psi x_2(n-1) \quad \text{Eq. A}$$

$$x_2(n) = x_2(n-1) - \psi x_1(n) \quad \text{Eq. B}$$

where the multiplication coefficient $$\psi = 2\sin\left(\frac{\omega_0}{2}\right)$$

As a result, digital sinusoidal signals which are generated are:

$$x_1(n) = \sin\left(\omega_0\left(n - \frac{1}{2}\right)\right)$$

$$x_2(n) = \cos(\omega_0 n)$$

The Equations A and B can be implemented in digital signal processing with a network diagram 10 using only addition, multiplication and delay elements as shown in FIG. 1. The diagram 10 includes a first digital delay element 12 (for example, in the form of a multi-bit data register comprising D-type flip-flops) that is configured to receive the nth value of the first sinusoidal digital output $x_1$ (and output the (n−1)th value of the first sinusoidal digital output $x_1$), and a second digital delay element 14 (for example, in the form of a multi-bit data register comprising D-type flip-flops) that is configured to receive the nth value of the second sinusoidal digital output $x_2$ and output the (n−1)th value of the second sinusoidal digital output $x_2$. The first and second sinusoidal digital outputs have a same frequency $\omega_0$, but different phase (for example, out of phase with each other by ninety degrees). The D-type flip-flops for the registers comprising the first and second digital delay elements 12, 14 are clocked by a clock signal CK operating at a frequency $f_{clock}$.

A first digital multiplier element 16 has a first input configured to receive the (n−1)th value of the second sinusoidal digital output $x_2$ from the Q output of the second digital delay element 14 and a second input configured to receive a multiplication coefficient $\psi$. The output of the first digital multiplier element 16 is provided to a first input of a first digital summing element 18 which has a second input configured to receive the (n−1)th value of the first sinusoidal digital output $x_1$ from the first digital delay element 12. The output of the first digital summing element 18 is the nth value of the first sinusoidal digital output $x_1$ applied to the D input of the first delay element 12. A second digital multiplier element 22 has a first input configured to receive the nth value of the first sinusoidal digital output $x_1$ (at the D input of the first digital delay element 12) and a second input configured to receive a multiplication coefficient $-\psi$. The output of the second digital multiplier element 22 is provided to a first input of a second digital summing element 24 which has a second input configured to receive the (n−1)th value of the second sinusoidal digital output $x_2$ from the D output of the second digital delay element 14. A digital to analog (D/A) conversion circuit 28 sequentially receives the values of the second sinusoidal digital output $x_2$ and generates an analog sinusoid output signal 30. The values of the first sinusoidal digital output $x_1$ may also be converted to generate an analog sinusoid output signal that has a same frequency but is out of phase from the signal 30.

The critical timing path of the network 10, which refers to the longest path between any Q output of a flip-flop and any D input of a flip-flop, is represented by the path from the Q output of the flip-flops for the delay element 12 to the D input of flip-flops for the delay element 14 through the first digital summing element 18, the second digital multiplier element 22 and the second digital summing element 24. This path represents the maximum logic delay of the digital signal processing operation and this delay can have a significant impact on the clock frequency $f_{clock}$ with which the network 10 operates (i.e., the rate at which digital values of the sinusoid are generated) because all three mathematical operations must be completed between consecutive cycles of the clock. There would be an advantage to reducing the length of the critical path in support of the generation of the stream of digital values for the sinusoidal output at a higher clock frequency.

SUMMARY

In an embodiment, an apparatus comprises: a first core process including: a first multiplier configured to multiply a first input with a first coefficient; a second multiplier configured to multiply a second input with a second coefficient; and a first adder configured to sum outputs of the first and second multipliers to generate a first output; a second core process including: a third multiplier configured to multiply a third input with a third coefficient; a fourth multiplier configured to multiply a fourth input with a fourth coefficient; and a second adder configured to sum outputs of the third and fourth multipliers to generate a second output; wherein the first and third inputs are derived from the second output; and wherein the second and fourth inputs are derived from the first output.

The first and second outputs provide digital values for first and second digital sinusoid signals, respectively, which have a same frequency but being offset in phase from each other.

In an embodiment, an apparatus comprises: a first multiplier configured to multiply a first input with a first coefficient; a first adder configured to generate a first output from a sum of an output of the first multiplier and second input; a second multiplier configured to multiply a third input with a second coefficient; a third multiplier configured to multiply a fourth input with a third coefficient; a second adder configured to generate a second output from a sum of outputs of the second and third multipliers; wherein the second and third inputs are derived from the first output; and wherein the first and fourth inputs are derived from the second output.

The first and second outputs provide digital values for first and second digital sinusoid signals, respectively, which have a same frequency but being offset in phase from each other.

In an embodiment, an apparatus comprises a scalable processing architecture comprising a plurality of core processes, wherein each core process comprises: a first multiplier configured to multiply a first input with a first coefficient; a second multiplier configured to multiply a second input with a second coefficient; and a first adder configured to sum outputs of the first and second multipliers to generate a first output; wherein the first inputs of the core processes are coupled together to receive a signal derived from the first output of a first one of the core processes; and wherein the second inputs of the core processes are coupled together to receive a signal derived from the first output of a second one of the core processes different from the first one of the core processes

BRIEF DESCRIPTION OF THE DRAWINGS

For a better understanding of the embodiments, reference will now be made by way of example only to the accompanying figures in which.

DETAILED DESCRIPTION

To reduce the critical path of the network 10, start with the Equations A and B:

$$x_1(n)=x_1(n-1)+\psi x_2(n-1)$$

$$x_2(n)=x_2(n-1)-\psi x_1(n)$$

By putting $x_1(n)$ into $x_2(n)$, the following is achieved:

$$x_2(n)=x_2(n-1)-\psi(x_1(n-1)+\psi x_2(n-1))$$

which can be rearranged as:

$$x_2(n)=(1-\psi^2)*x_2(n-1)-\psi x_1(n-1)$$

Let $K1=1-\psi^2$
The result is:

$$x_1(n)=x_1(n-1)+\psi x_2(n-1) \quad \text{Eq. C}$$

$$x_2(n)=K1*x_2(n-1)-\psi x_1(n-1) \quad \text{Eq. D}$$

Figure 2:
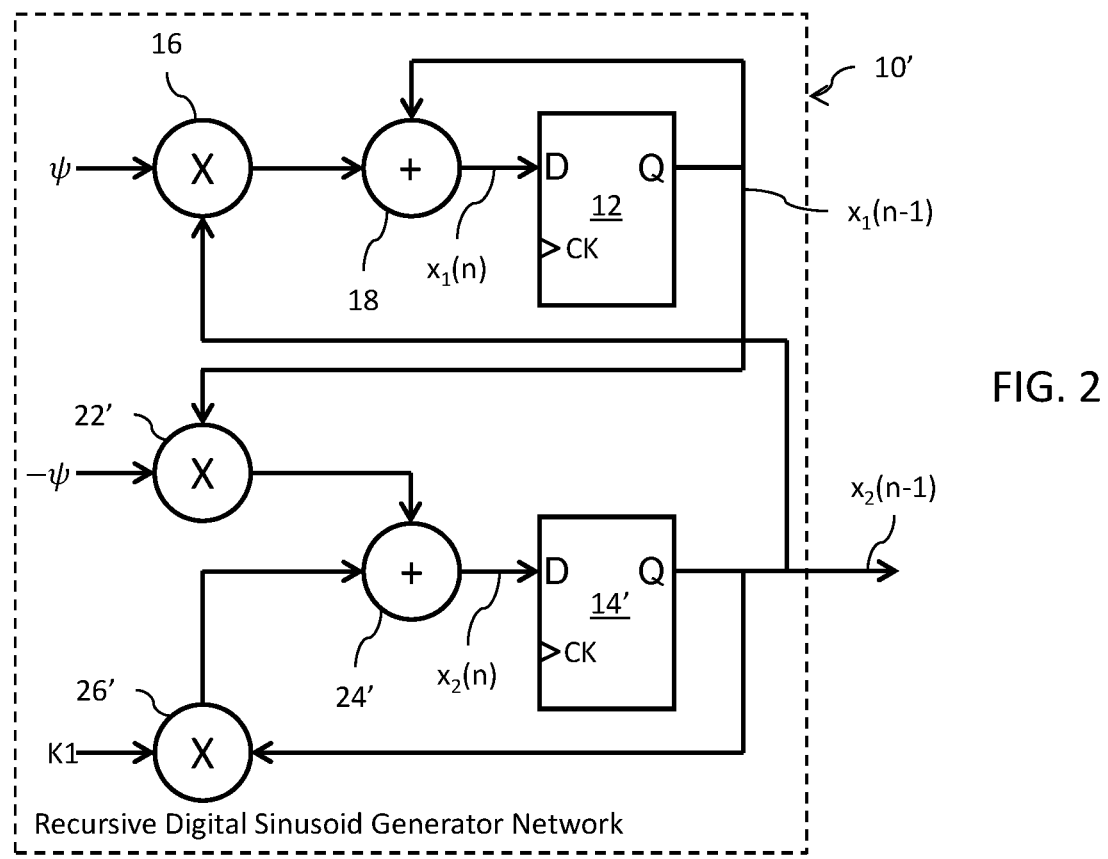
FIG. 2 is a network diagram for a digital signal processing implementation of a recursive digital sinusoid generator.

The Equations C and D can be implemented in digital signal processing with a network diagram 10' using only addition, multiplication and delay elements as shown in FIG. 2. The diagram 10' includes a first digital delay element 12 (for example, in the form of a multi-bit data register comprising D-type flip-flops) that is configured to receive the nth value of the first sinusoidal digital output $x_1$ (and output the (n−1)th value of the first sinusoidal digital output $x_1$), and a second digital delay element 14' (for example, in the form of a multi-bit data register comprising D-type flip-flops) that is configured to receive the nth value of the second sinusoidal digital output $x_2$ (and output the (n−1)th value of the second sinusoidal digital output $x_2$). The first and second sinusoidal digital outputs have a same frequency $\omega_0$, but different phase (for example, out of phase with each other by ninety degrees). The D-type flip-flops for registers forming the first and second digital delay elements 12, 14' are clocked by a clock signal CK having a frequency $f_{clock}$.

A first digital multiplier element 16 has a first input configured to receive the (n−1)th value of the second sinusoidal digital output $x_2$ from the Q output of the second digital delay element 14' and a second input configured to receive a multiplication coefficient $\psi$. The output of the first digital multiplier element 16 is provided to a first input of a first digital summing element 18 which has a second input configured to receive the (n−1)th value of the first sinusoidal digital output $x_1$ from the Q output of the first digital delay element 12. The output of the first digital summing element 18 is the nth value of the first sinusoidal digital output $x_1$ to be stored in the first delay element 12. A second digital multiplier element 22' has a first input configured to receive the (n−1)th value of the first sinusoidal digital output $x_1$ from the Q output of the first digital delay element 12 and a second input configured to receive a multiplication coefficient $-\psi$. The output of the second digital multiplier element 22' is provided to a first input of a second digital summing element 24'. A third digital multiplier element 26' has a first input configured to receive the (n−1)th value of the second sinusoidal digital output $x_2$ from the Q output of the second digital delay element 14' and a second input configured to receive a multiplication coefficient K1. The output of the third digital multiplier element 26' is provided to a second input of the second digital summing element 24'. The output of the second digital summing element 24' is the nth value of the second sinusoidal digital output $x_2$ to be stored in the second digital delay element 14'.

Figure 1:
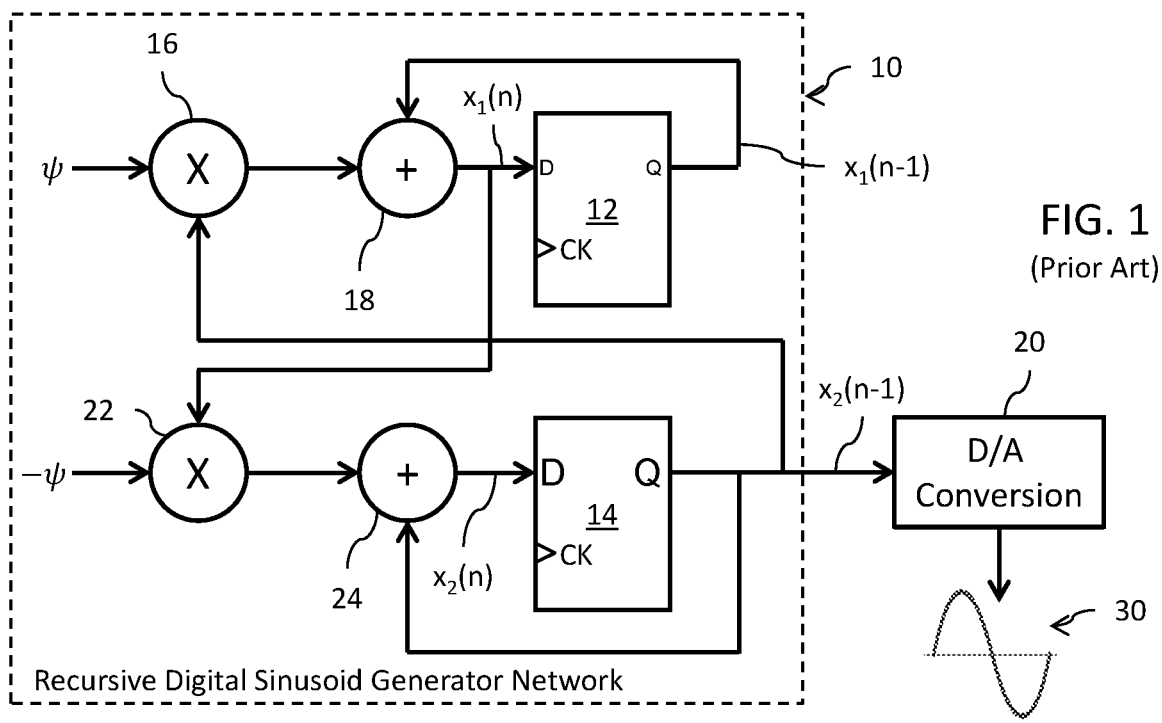
FIG. 1 is a network diagram for a digital signal processing implementation of a recursive digital sinusoid generator.

It will be noted that the network 10' has a critical path advantage over the network 10 of FIG. 1 in that the longest path between any Q output of a flip-flop and any D input of a flip-flop includes just one digital multiplier element and one digital summing element, and thus the maximum logic delay here is shorter than with the network 10 of FIG. 1. As a result, the network 10' is capable of operation at a higher clock frequency.

Figure 3:
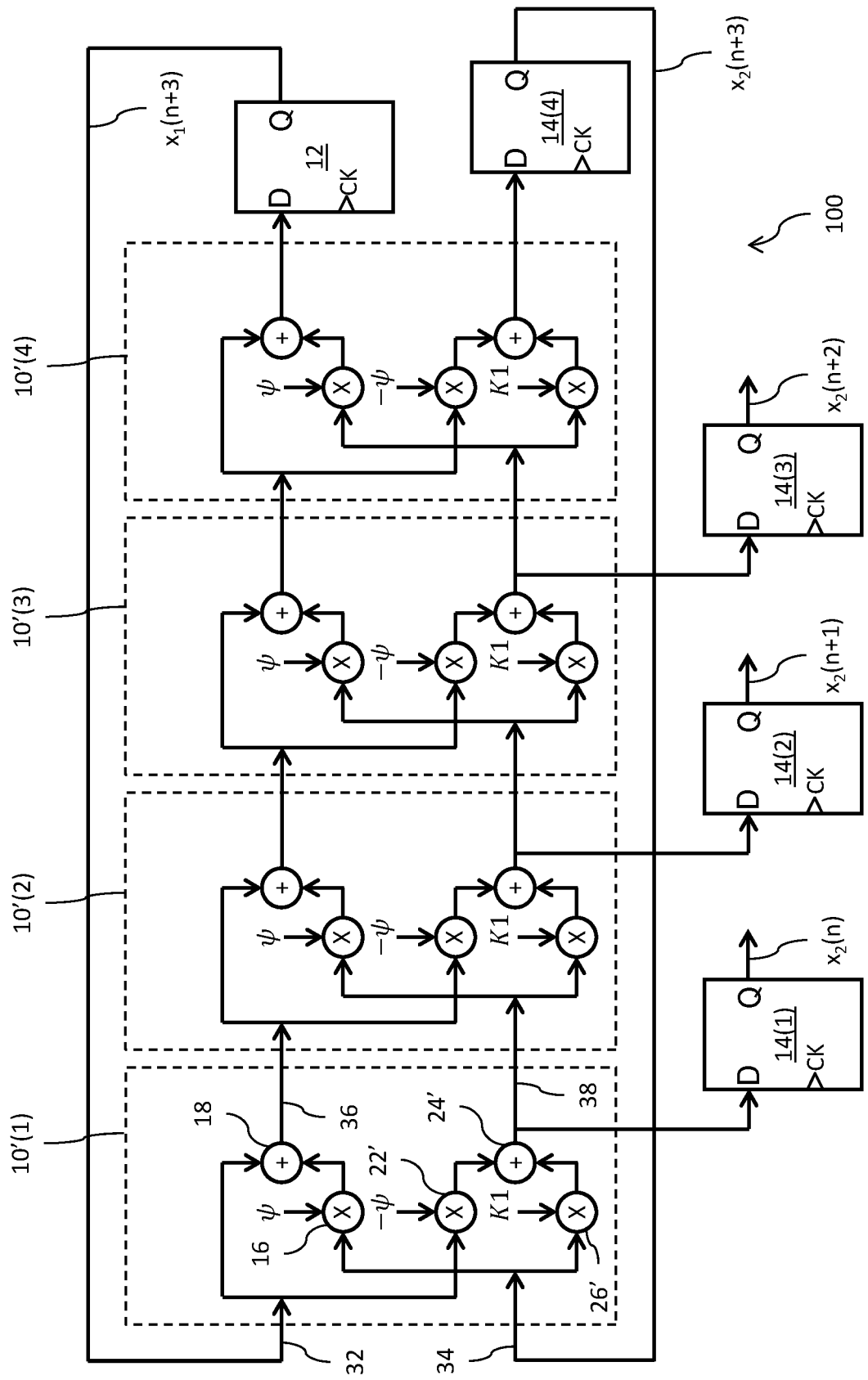
FIG. 3 is a network diagram for a digital signal processing implementation of a recursive digital sinusoid generator.

The network 10' represents a core recursion for sinusoid generation which can be replicated as shown in FIG. 3 to simultaneously generate multiple consecutive values of the sinusoid in order to generate the digital values for the output sinusoid at a higher effective clock frequency. As an example, a goal would be to unwrap the core recursion four times in order to simultaneously generate four consecutive digital values ($x_2(n)$, $x_2(n+1)$, $x_2(n+2)$, $x_2(n+3)$) of the sinusoid for each cycle of the clock CK, which would theoretically permit generation of digital values for the sinusoid at a rate that is effectively four times the clock frequency of the network 10'.

Each core recursion 10'(1)-10'(4) includes a first digital summing element 18 having a first input configured to receive a first digital input signal 32. A first digital multiplier element 16 has a first input configured to receive a second digital input signal 34 and a second input configured to receive a multiplication coefficient $\psi$. The output of the second digital multiplier element 16 is provided to a second input of the first digital summing element 18. The output of the first digital summing element 18 provides a first digital output signal 36. A second digital multiplier element 22' has a first input configured to receive the first digital input signal 32 and a second input configured to receive a multiplication coefficient $-\psi$. The output of the third digital multiplier element 22' is provided to a first input of a second digital summing element 24'. A fourth digital multiplier element 26' has a first input configured to receive the second digital input signal 34 and a second input configured to receive a multiplication coefficient K1. The output of the fourth digital multiplier element 26' is provided to a second input of the second digital summing element 24'. The output of the second digital summing element 24' provides a second digital output signal 38.

The core recursions 10'(1)-10'(4) are connected in series (cascade) with feedback. The first and second digital output signals 36, 38 from the core recursion 10'(1) provide the first and second digital input signals 32, 34, respectively, for the core recursion 10'(2). The first and second digital output signals 36, 38 from the core recursion 10'(2) provide the first and second digital input signals 32, 34, respectively, for the core recursion 10'(3). The first and second digital output signals 36, 38 from the core recursion 10'(3) provide the first and second digital input signals 32, 34, respectively, for the core recursion 10'(4). The first digital output signal 36 from the core recursion 10'(4) is applied to the input of a first delay element 12 (for example, comprising a multibit register formed of D-type flip-flops) configured to store the (n+3)th value of the first sinusoidal digital output $x_1$, which is further provided, in feedback, from the Q output to the first digital input signal 32 for the core recursion 10'(1). The second digital output signal 38 from the core recursion 10'(4) is applied to the input of a second delay element 14(4) (for example, comprising a multibit register formed of D-type flip-flops) configured to store the (n+2)th value of the second sinusoidal digital output $x_2$, which is further provided, in feedback, from the Q output to the second digital input signal 34 for the core recursion 10'(1). The second digital output signal 38 from the core recursion 10'(3) is applied to the input of a third delay element 14(3) (for example, comprising a multibit register formed of D-type flip-flops) configured to store the (n+2)th value of the second sinusoidal digital output $x_2$. The second digital output signal 38 from the core recursion 10'(2) is applied to the input of a fourth delay element 14(2) (for example, comprising a multibit register formed of D-type flip-flops) configured to store the (n+1)th value of the second sinusoidal digital output $x_2$. Lastly, the second digital output signal 38 from the core recursion 10'(1) is applied to the input of a fifth delay element 14(1) (for example, comprising a multibit register formed of D-type flip-flops) configured to store the (n)th value of the second sinusoidal digital output $x_2$. The D-type flip-flops within the registers for the first through fifth digital delay elements 12, 14' are clocked by a clock signal CK having a clock frequency $f_{clock}$.

The replication of the core recursion as shown in FIG. 3, however, introduces a concern with the critical path. Here, it will be noted that the longest path between any Q output of a flip-flop in a delay element and any D input of a flip-flop in a delay element includes four digital multiplier elements and four digital summing elements. As a result, the network 100 has difficulty in operating to generate digital values of the sinusoid at a desired higher frequency rate (for example, the network cannot effectively operate to generate four times as many samples per cycle of the clock (at the same frequency $f_{clock}$) as the network 10' of FIG. 2).

To reduce the critical path of the network 100, start with the Equations C and D for the core recursion of network 10':

$$x_1(n) = (n-1) + x_2(n-1)$$

$$x_2(n) = K1 * x_2(n-1) - \psi(n-1)$$

Let m1=$-\psi$ and m2=K1, which results in:

$$x_1(n) = x_1(n-1) - m1 * x_2(n-1) \quad \text{Eq. 1}$$

$$x_2(n) = m1 * x_1(n-1) + m2 * x_2(n-1) \quad \text{Eq. 2}$$

Now, we calculate the next three samples of the sinusoidal output ($x_2(n+1)$, $x_2(n+2)$, $x_2(n+3)$) in terms of the present sample $x_1(n-1)$, $x_2(n-1)$. By putting n=n+1, then:

$$x_2(n+1) = m1(x_1(n)) + m2(x_2(n))$$

where the multiplication coefficient $$m1 = -2 * \sin\left(\frac{\omega_0}{2}\right)$$

and the multiplication coefficient m2=$2*\cos(\omega_0)-1$

From Equations 1 and 2 above, then:

$$x_2(n+1) = m1*(x_1(n-1) - m1*x_2(n-1)) + m2(m2*x_2(n-1) + m1*x_1(n-1))$$

Simplified, this becomes:

$$x_2(n+1) = (m1 + m2*m1)x_1(n-1) + (m2*m2 - m1*m1)x_2(n-1)$$

Let multiplication coefficient $$m3 = m1 + m2 * m1 = -2\left(\sin\left(\frac{3\omega_0}{2}\right) - \sin\left(\frac{\omega_0}{2}\right)\right)$$

Let multiplication coefficient m4=$m2*m2-m1*m1=2(\cos(2\omega_0)-\cos(\omega_0))+1$ Then:

$$x_2(n+1) = m3*x_1(n-1) + m4*x_2(n-1) \quad \text{Eq. 3}$$

Figure 4:
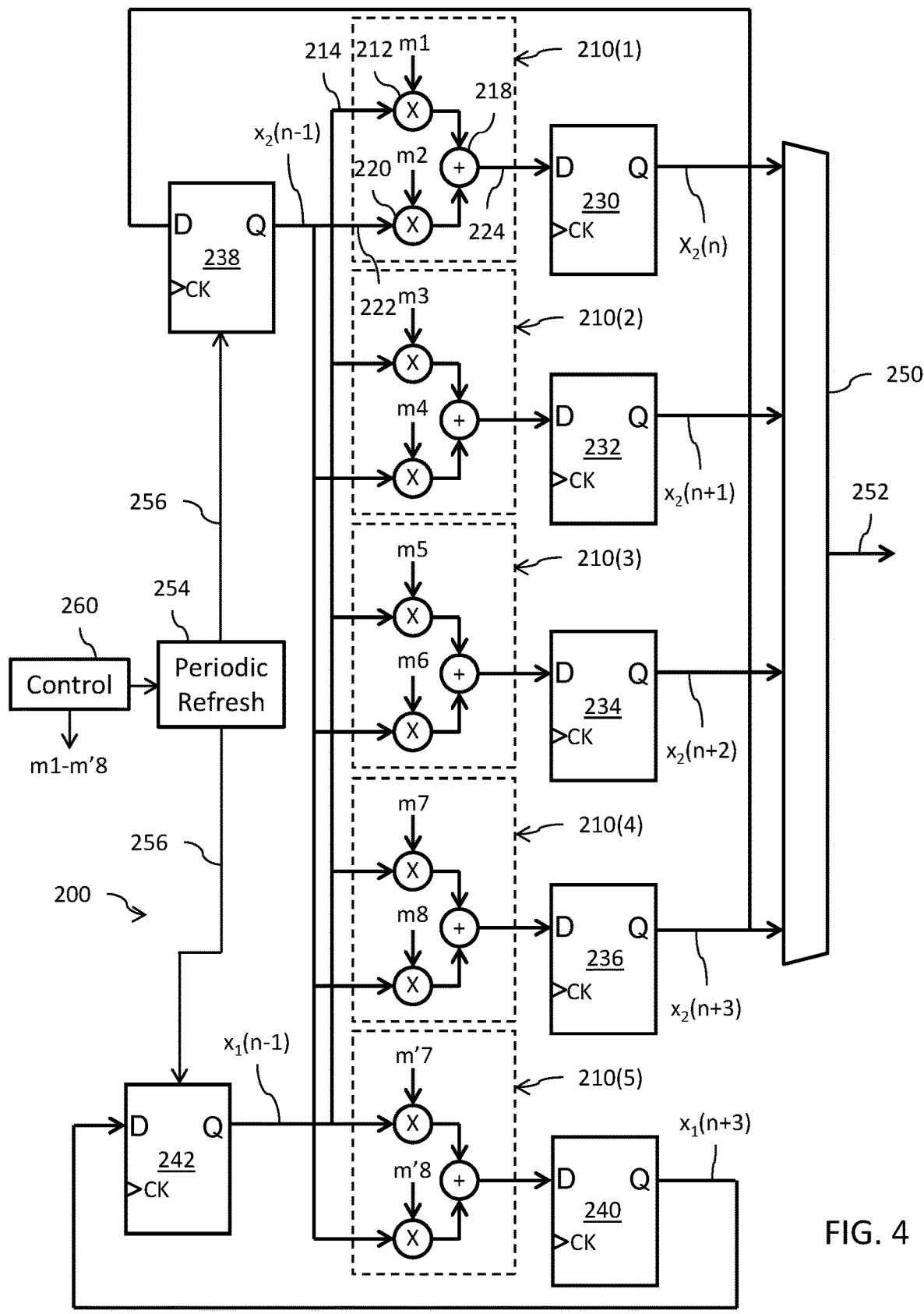
FIG. 4 is a network diagram for a digital signal processing implementation of a recursive digital sinusoid generator.

A similar process is then used to generate:

$$x_2(n+2) = m5*x_1(n-1) + m6*x_2(n-1) \quad \text{Eq. 4}$$

where:
the multiplication coefficient $$m5 = -2\left(\sin\left(\frac{5\omega_0}{2}\right) - \sin\left(\frac{3\omega_0}{2}\right) + \sin\left(\frac{\omega_0}{2}\right)\right)$$

the multiplication coefficient m6=$2(\cos(3\omega_0)-\cos(2\omega_0)+\cos(\omega_0))-1$ and:

$$x_2(n+3) = m7*x_1(n-1) + m8*x_2(n-1) \quad \text{Eq. 5}$$

where the multiplication coefficient $$m7 = -2\left(\sin\left(\frac{7\omega_0}{2}\right) - \sin\left(\frac{5\omega_0}{2}\right) + \sin\left(\frac{3\omega_0}{2}\right) - \sin\left(\frac{\omega_0}{2}\right)\right)$$

and the multiplication coefficient m8=$2(\cos(4\omega_0)-\cos(3\omega_0)+\cos(2\omega_0)-\cos(\omega_0))+1$ Using a similar process, calculation of the next three samples of the sinusoidal output ($x_1(n+1)$, $x_1(n+2)$, $x_1(n+3)$) in terms of the present sample $x_1(n-1)$, $x_2(n-1)$ is made to produce:

$$x_1(n+3) = m'7*x_1(n-1) + m'8*x_2(n-1) \quad \text{Eq. 6}$$

where the multiplication coefficients: $m'0=1$, $m'1=-\psi$, $m'2=K1$ and:

multiplication coefficient $m'3=m'0-m'1*m'1$
multiplication coefficient $m'4=m'0*m'1+m'1*m'2$
multiplication coefficient $m'5=m'3-m'4*m'1$
multiplication coefficient $m'6=m'3*m'1+m'4*m'2$
multiplication coefficient $m'7=m'5-m'6*m'1$ and
multiplication coefficient $m'8=m'5*m'1+m'6*m'2$ The Equations 1-6 can be implemented in digital signal processing with a network diagram 200 using only addition, multiplication and delay elements as shown in FIG. 4. It will be noted that each of the Equations 1-6 share a common processing operation in the form of $x=a*x_1(n-1)+b*x_2(n-1)$, where a and b are constants (multiplication coefficients) with values as noted above. Because of this, a core process 210 can be replicated plural times for the network diagram 200. The core process 210 includes a first digital multiplier element 212 having a first input configured to receive a first digital input signal 214 corresponding to the value $x_1(n-1)$ and a second input configured to receive the multiplication coefficient a. The output of the first digital multiplier element 212 is provided to a first input of a digital summing element 218. A second digital multiplier element 220 has a first input configured to receive a second digital input signal 222 corresponding to the value $x_2(n-1)$ and a second input configured to receive the multiplication coefficient b. The output of the second digital multiplier element 220 is provided to a second input of the digital summing element 218. The output of the digital summing element 218 provides a digital output signal 224.

In a first core process 210(1), multiplication coefficients are a=m1 and b=m2. The digital output signal 224 from the first core process 210(1) is applied to the input of a delay element 230 (for example, comprising a multibit register formed of D-type flip-flops) configured to store the (n)th value of the second sinusoidal digital output $x_2$.

In a second core process 210(2), multiplication coefficients are a=m3 and b=m4. The digital output signal 224 from the second core process 210(2) is applied to the input of a delay element 232 (for example, comprising a multibit register formed of D-type flip-flops) configured to store the (n+1)th value of the second sinusoidal digital output $x_2$.

In a third core process 210(3), multiplication coefficients are a=m5 and b=m6. The digital output signal 224 from the third core process 210(3) is applied to the input of a delay element 234 (for example, comprising a multibit register formed of D-type flip-flops) configured to store the (n+2)th value of the second sinusoidal digital output $x_2$.

In a fourth core process 210(4), multiplication coefficients are a=m7 and b=m8. The digital output signal 224 from the fourth core process 210(4) is applied to the input of a delay element 236 (for example, comprising a multibit register formed of D-type flip-flops) configured to store the (n+3)th value of the second sinusoidal digital output $x_2$, with the Q output of the delay element 236 providing, in feedback, a digital signal applied to the input of a delay element 238 (for example, comprising a multibit register formed of D-type flip-flops) configured to store the (n−1)th value of the second sinusoidal digital output $x_2$. The Q output of the delay element 238 provides the second digital input signal 222.

In a fifth core process 210(5), multiplication coefficients are a=m'7 and b=m'8. The digital output signal 224 from the fifth core process 210(5) is applied to the input of a delay element 240 (for example, comprising a multibit register formed of D-type flip-flops) configured to store the (n+3)th value of the first sinusoidal digital output $x_1$, with the Q output of the delay element 240 providing, in feedback, a digital signal applied to the input of a delay element 242 (for example, comprising a multibit register formed of D-type flip-flops) configured to store the (n−1)th value of the first sinusoidal digital output $x_1$. The Q output of the delay element 242 provides the second digital input signal 214.

The D-type flip-flops for registers forming the digital delay elements 230-242 are clocked by a clock signal CK having a clock frequency $f_{clock}$.

The Q outputs of the digital delay elements 230-236 are applied to the inputs of a multiplexer 250 which functions as a parallel to serial converter producing the digital sinusoid output signal 252 as a series of digital values from the (n)th to (n+3)th digital outputs of sinusoid $x_2$ which are produced in parallel. The output data rate for signal 252 at the output of the four-to-one multiplexer 250 is four times the clock frequency $f_{clock}$. The digital sinusoid output signal 252 from the multiplexer 250 can be converted to an analog sinusoid signal (see, for comparison, the conversion performed in FIG. 1). It will also be noted that the digital values for the sinusoid $x_2$ produce a digital sinusoid output signal that can also be converted to an analog signal (the two sinusoids having a same frequency but are out of phase with each by ninety degrees).

An advantage of the implementation of FIG. 4 is that it is easily scalable by simply adding additional core processes 210 having inputs connected in parallel with the other core processes. Calculation of the proper multiplication coefficients a and b would be needed for each added core process, with the last included core process having its output coupled in feedback. As will be appreciated by those skilled in the art, the number of registers (flip-flops) does not increase drastically with increased parallelism for increased throughput.

A concern with the use of a recursive function, such as is implemented with the networks 10', 100, 200, is the accumulation of quantization errors due to finite word length width with respect to the recursively generated data. Consider in this regard the example of the multiplication and summation operations performed by each core process (see, references 212 and 218 in FIG. 4 as an example). If the inputs are both five bit numbers, their product doubles the number of bits to ten and their sum may produce an additional bit as a carry. If the delay elements formed by the flip-flops, however, are provided with a capacity for storing the data in fewer bits than are produced, for example five bits, then the resulting product or sum must somehow be converted to five bits. Many techniques for such a conversion are known to those skilled in the art (rounding, flooring, ceiling, etc.). This conversion process is referred to as quantization, and the difference between the two values is the quantization error. With each iteration of the recursion operation, however, there is an accumulation of the quantization error and the accuracy of the signal output of the network becomes increasingly degraded.

To address this concern, the digital values stored in the delay elements 238 and 242 which provide the (n−1)th digital values for sinusoid $x_1$ and sinusoid $x_2$ are periodically refreshed with accurate values using a refresh circuit 254. The refresh circuit 254 may, for example, include a high precision sine value generator which operates to generate a set of replacement values 256 which comprise high precision values for the recursive data of the (n−1)th digital values for sinusoid $x_1$ and sinusoid $x_2$. On a periodic basis, the generated set of replacement values 256 is loaded into the delay elements 238 and 242 and further recursive calculations will be derived from the newly loaded replacement values 256 (instead of the previously calculated recursive values from delay elements 236 and 240 which included the accumulated error). The rate at which the replacement values 256 are loaded into the delay elements 238 and 242 is a fraction of the frequency of the clock signal. For example, the rate may be $f_{clock}/M$, where M is much greater than 1 and typically is an integer value in the range of a few hundred to a few thousand. Thus, once every M clock cycles the recursive digital sinusoid generator 200 is loaded with the set of replacement values 256 that were periodically generated by the high precision sine value generator of the refresh circuit 254.

The replacement may be accomplished, for example, by flushing and reloading the registers formed by delay elements 238 and 242. This operation will effectively eliminate the finite precision error which creeps into the recursive calculations over time by periodically updating the recursive data with high precision replacement values. The once every M clock cycles timing for replacement is configurable and thus the particular sine angle where the flush and replace operation occurs is known in advance. The high precision sine value generator within the refresh circuit 254 operates to pre-calculate the correct (with high precision) values for the recursive data as the replacement values 256 for that particular sine angle for loading at the proper time so that there is no interruption in the generation of the digital sinusoid output.

The high precision sine value generator within the refresh circuit 254 may be implemented using a coordinate rotation digital computer (CORDIC). Those skilled in the art understand that CORDIC implements a hardware efficient iterative method which uses rotations to calculate a wide range of elementary functions. In this case, the elementary function calculated by CORDIC is the sinusoid function. The CORDIC may operate at the same frequency $f_{clock}$ as the recursive digital sinusoid generator 200. However, the throughput of the CORDIC is orders of cycles less than the recursive digital sinusoid generator 200 since many cycles of the clock signal are needed to make each calculation of the replacement values. The CORDIC can be highly hardware optimized because it is operating at a lower speed than the recursive digital sinusoid generator 200. This relaxed implementation allows the CORDIC to perform its operations sequentially, and this advantageously enables hardware reuse across iterations with an accompanying savings in occupied circuit area and power consumption.

The CORDIC operation of interest is as a high precision sine angle calculator from which the replacement values associated with the particular sine angle of interest are generated. The particular sine angles of interest where the periodic correction operation is to be performed are known to CORDIC in advance. For example, those angles of interest are selected so as to arise prior to unacceptable deterioration in the precision of the values for the digital sinusoid output 252. During the M clock cycles preceding occurrence of the next sine angle of interest, the CORDIC operates to generate the impending replacement values associated with that next sine angle of interest. When the sample value of n is reached that corresponds to that next sine angle of interest, the CORDIC of the high precision sine value generator makes the replacement values available for loading into the delay elements 238 and 242 of the recursive digital sinusoid generator 200.

The digital sinusoid generator 200 includes a control circuit 260 which can specify the characteristics of the desired sinusoid output to be generated by specifying the values for the multiplication coefficients m1-m8 and m'7-m'8 and providing, on a periodic basis, the (n−1)th digital values for sinusoid $x_1$ and sinusoid $x_2$ for the delay elements 238 and 242. An appropriate control signal is applied to the refresh circuit 254 to cause the loading of the values both on an initial (startup) basis and furthermore on a periodic basis to perform the refresh. The control circuit 260 tracks the digital sinusoid output 252 and based on the value of M instructs the high precision sine value generator within the refresh circuit 254 with an identification of the next sine angle of interest for pre-calculation of the replacement values. At the proper time when the sample value of n for the generated digital sinusoid output 252 is reached that corresponds to that sine angle of interest, the control circuit 160 instructs the refresh circuit 254 to cause loading of the replacement values 256 which were pre-calculated by the high precision sine value generator. A more precise next value for the digital sinusoid output 252 is then generated by the recursive digital sinusoid generator 200. Production of the (n)th through (n+3)th values of the digital sinusoid output 252 in response to the clock CK at the frequency $f_{clock}$ is not interrupted by the process to load the replacement values.

It will be understood that the control circuit 260 and refresh circuit 254, even though not explicitly shown in FIGS. 2 and 3, are also used.

The systems of FIGS. 2-4 can be implemented in any suitable hardware, software, firmware, or a combination thereof, without departing from the scope of the invention.

The system may include a processor and a memory, the memory having the computer executable instructions for executing a process for implementing the recursive sine generation and CORDIC processing operations. The computer executable instructions, in whole or in part, may also be stored on a computer readable medium separated from the system on which the instructions are executed. The computer readable medium may include any volatile or non-volatile storage medium such as flash memory, compact disc memory, and the like.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. An apparatus, comprising:
a first core process including:
a first multiplier configured to multiply a first input with a first coefficient;
a second multiplier configured to multiply a second input with a second coefficient; and
a first adder configured to sum outputs of the first and second multipliers to generate a first output;
a second core process including:
a third multiplier configured to multiply a third input with a third coefficient;
a fourth multiplier configured to multiply a fourth input with a fourth coefficient; and
a second adder configured to sum outputs of the third and fourth multipliers to generate a second output; and
a third core process including:
a fifth multiplier configured to multiply a fifth input with a fifth coefficient;

a sixth multiplier configured to multiply a sixth input with a sixth coefficient; and
a third adder configured to sum outputs of the fifth and sixth multipliers to generate a third output;
wherein the first, third and fifth inputs are derived from the second output; and
wherein the second, fourth and sixth inputs are derived from the first output.

2. The apparatus of claim 1, wherein the first and third outputs are consecutive digital values of a first digital sinusoid signal.

3. The apparatus of claim 2, further comprising a parallel to serial converter configured to serially output the consecutive digital values of the first and third outputs.

4. The apparatus of claim 1, wherein the second output is a digital value of a second digital sinusoid signal having a same frequency as the first digital sinusoid signal but being offset in phase from the first digital sinusoid signal.

5. The apparatus of claim 1, further comprising:
a first delay element configured to store the first output and generate the second and fourth inputs; and
a second delay element configured to store the second output and generate the first and third inputs.

6. The apparatus of claim 5, wherein each of the first and second delay elements are multibit digital registers.

7. The apparatus of claim 6, where each multibit digital register is formed by D-type flip-flops.

8. The apparatus of claim 7, wherein the D-type flip-flops are clocked by a same clock signal.

9. The apparatus of claim 1, wherein the first output is a digital value of a first digital sinusoid signal.

10. The apparatus of claim 9, wherein the second output is a digital value of a second digital sinusoid signal having a same frequency as the first digital sinusoid signal but being offset in phase from the first digital sinusoid signal.

11. The apparatus of claim 1, further comprising:
a first delay element configured to store the first output and generate the second and fourth inputs; and
a second delay element configured to store the second output and generate the first and third inputs.

12. The apparatus of claim 11, wherein each of the first and second delay elements are multibit digital registers.

13. The apparatus of claim 12, where each multibit digital register is formed by D-type flip-flops.

14. The apparatus of claim 13, wherein the D-type flip-flops are clocked by a same clock signal.

15. The apparatus of claim 11, further comprising:
a third delay element positioned between the first output and the first delay element; and
a fourth delay element positioned between the second output and the second delay element.

16. The apparatus of claim 15, wherein each of the first through fourth delay elements are multibit digital registers.

17. The apparatus of claim 16, where each multibit digital register is formed by D-type flip-flops.

18. The apparatus of claim 17, wherein the D-type flip-flops are clocked by a same clock signal.

19. An apparatus, comprising:
a first core process including:
a first multiplier configured to multiply a first input with a first coefficient;
a second multiplier configured to multiply a second input with a second coefficient; and
a first adder configured to sum outputs of the first and second multipliers to generate a first output;
a second core process including:
a third multiplier configured to multiply a third input with a third coefficient;
a fourth multiplier configured to multiply a fourth input with a fourth coefficient; and
a second adder configured to sum outputs of the third and fourth multipliers to generate a second output;
a first delay element configured to store the first output and generate the second and fourth inputs;
a second delay element configured to store the second output and generate the first and third inputs;
wherein the first and second delay elements store values of the first and second outputs at a first rate set by a clock signal;
a sinusoid value generator configured to generate replacement values at a second rate which is less than the first rate; and
a control circuit configured to cause a periodic replacement of the values of the first and second outputs stored in the first and second delay elements with the generated replacement values.

20. The apparatus of claim 19, wherein the sinusoid value generator comprises a coordinate rotation digital computer (CORDIC) configured to generate the replacement values for certain angles of a desired sinusoid.

21. An apparatus, comprising a scalable processing architecture comprising a plurality of core processes, wherein each core process comprises:
a first multiplier configured to multiply a first input with a first coefficient;
a second multiplier configured to multiply a second input with a second coefficient;
a first adder configured to sum outputs of the first and second multipliers to generate a first output;
a first delay element configured to store the first output; and
a second delay element configured to store an output of the first delay element;
wherein the first inputs of the core processes are coupled together to receive a signal derived from an output of the second delay element for a first one of the core processes; and
wherein the second inputs of the core processes are coupled together to receive a signal derived from the output of the second delay element for a second one of the core processes different from the first one of the core processes.

22. The apparatus of claim 21, wherein the first coefficient for the first one of the core processes and the first coefficient for the second one of the core processes are different, and wherein the second coefficient for the first one of the core processes and the second coefficient for the second one of the core processes are different.

23. The apparatus of claim 22, wherein the first and second coefficients are selected so that the outputs of the first delay elements define sinusoidal signals.

24. The apparatus of claim 21, wherein each of the first and second delay elements is a multibit digital register.

25. The apparatus of claim 24, where each multibit digital register is formed by a D-type flip-flop.

26. The apparatus of claim 25, wherein the D-type flip-flops are clocked by a same clock signal.

27. The apparatus of claim 21, wherein the first and second delay elements store values at a first rate set by a clock signal, further comprising:
a sinusoid value generator configured to generate replacement values at a second rate which is less than the first rate; and a control circuit configured to cause a periodic replacement of the values stored in the second delay element with the generated replacement values.

28. The apparatus of claim 27, wherein the sinusoid value generator comprises a coordinate rotation digital computer (CORDIC) configured to generate the replacement values for certain angles of a desired sinusoid.

\* \* \* \* \*